United States Patent
Chang et al.

(10) Patent No.: US 9,891,511 B2
(45) Date of Patent: Feb. 13, 2018

(54) ILLUMINATION SYSTEM AND WAVELENGTH-CONVERTING DEVICE THEREOF

(71) Applicant: DELTA ELECTRONICS, INC., Taoyuan (TW)

(72) Inventors: Keh-Su Chang, Taoyuan (TW); Yen-I Chou, Taoyuan (TW); Chi Chen, Taoyuan (TW); Jau-Shiu Chen, Taoyuan (TW); Meng-Han Liu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 276 days.

(21) Appl. No.: 14/686,321

(22) Filed: Apr. 14, 2015

(65) Prior Publication Data

US 2015/0308637 A1    Oct. 29, 2015

Related U.S. Application Data

(60) Provisional application No. 61/984,418, filed on Apr. 25, 2014.

(30) Foreign Application Priority Data

Dec. 11, 2014    (TW) .............................. 103143268 A

(51) Int. Cl.
*G03B 21/20* (2006.01)
*G03B 21/16* (2006.01)
(Continued)

(52) U.S. Cl.
CPC ............ *G03B 21/204* (2013.01); *G03B 21/16* (2013.01); *C09K 11/02* (2013.01); *H01L 33/507* (2013.01)

(58) Field of Classification Search
USPC ........................................................ 362/84
See application file for complete search history.

(56) References Cited

U.S. PATENT DOCUMENTS

2011/0149549 A1* 6/2011 Miyake .................... F21V 7/22
                                                                362/84
2011/0279012 A1   11/2011 Washizu et al.
(Continued)

FOREIGN PATENT DOCUMENTS

JP          2010198805          9/2010
JP          2011129406          6/2011
(Continued)

*Primary Examiner* — Sharon Payne
(74) *Attorney, Agent, or Firm* — Kirton McConkie; Evan R. Witt

(57) ABSTRACT

An illumination system includes a solid-state light-emitting element and a wavelength-converting device. A first waveband light is emitted to an optical path by the solid-state light-emitting element. The wavelength-converting device is disposed on the optical path and includes a phosphor plate. The phosphor plate is a solid mixture having a phosphor agent and a binder. The weight percent of the phosphor agent is from 10 to 70, such that the first waveband light is transformed into a second waveband light. Under this circumstance, the efficiency of heat conduction of the phosphor plate is effectively enhanced, thereby enhancing the converting efficiency of the wavelength-converting device, which is strong enough to be applied to rotate with great rigidity. Meanwhile, not only the space requirement is reduced, but also the phenomena of hot spot and heat diffusion are avoided, such that the cost and difficulty of manufacturing the wavelength-converting device are significantly reduced.

11 Claims, 9 Drawing Sheets

(51) Int. Cl.
*H01L 33/50* (2010.01)
*C09K 11/02* (2006.01)

(56) References Cited

U.S. PATENT DOCUMENTS

| | | | | |
|---|---|---|---|---|
| 2013/0083296 A1* | 4/2013 | Ogura | ............... | G03B 21/204 353/31 |
| 2013/0286359 A1* | 10/2013 | Motoya | ............... | F21V 9/08 353/31 |
| 2014/0111776 A1* | 4/2014 | Yang | ............... | F21V 9/16 353/31 |

FOREIGN PATENT DOCUMENTS

| | | |
|---|---|---|
| JP | 2012243618 | 12/2012 |
| JP | 2012243727 | 12/2012 |
| JP | 2013122930 | 6/2013 |
| JP | 2014501438 | 1/2014 |
| TW | 200411228 | 7/2004 |
| TW | 201312787 | 3/2013 |
| TW | 201319718 | 5/2013 |
| WO | 2012014439 | 2/2012 |
| WO | 2012138020 | 10/2012 |
| WO | 2013055552 | 4/2013 |
| WO | 2013056570 | 4/2013 |

\* cited by examiner

ILLUMINATION SYSTEM AND WAVELENGTH-CONVERTING DEVICE THEREOF

CROSS-REFERENCE TO RELATED APPLICATION

This application claims the benefit of U.S. Provisional Application No. 61/984,418 filed on Apr. 25, 2014, and entitled "PHOSPHOR PLATELET WHEEL (PPW)", the entirety of which is hereby incorporated by reference.

FIELD OF THE INVENTION

The present invention relates to an illumination system, and more particularly to an illumination system and a wavelength-converting device thereof.

BACKGROUND OF THE INVENTION

In recent years, high-end projectors utilize laser elements and wavelength-converting devices as illumination systems. The conventional wavelength-converting devices can be classified into two kinds of wavelength-converting device, one of which is a rotational phosphor wheel, and another one of which is a fixed phosphor plate module.

Please refer to FIG. 1 and FIG. 2. FIG. 1 schematically illustrates the structure of a rotational phosphor wheel of prior art. FIG. 2 schematically illustrates the structure of a fixed phosphor plate module of prior art. In a rotational phosphor wheel 1, phosphor powder (or phosphor agent) 11 is mixed with adhesive glues and coated on a specific position of the high-reflective substrate 10, which is circle-shaped. The high-reflective substrate 10 is installed on a motor 12, so that the heat-dissipation may be implemented through rotating by the rotational phosphor wheel 1 during performing wavelength conversions. On the other hand, since the heat-dissipation cannot be implemented through rotating by the fixed phosphor plate module 2, the phosphor plate 21 is generally mounted onto a surface of a high-reflective substrate 20, and a heat sink 22 is mounted on another surface of the high-reflective substrate 20. Under this circumstance, the heat generated by the laser source may be dissipated.

However, in the rotational phosphor wheel 1, the converting efficiency of phosphor powder 11 is low because of low reliability and low thermal conductivity of adhesive glues. Meanwhile, the rigidity of the high-reflective substrate 10 may be not enough to be applied through rotation and shake. In addition, in the fixed phosphor plate module 2, the heat-dissipation of the heat sink 22 is mainly implemented through conduction and convection, so the high-reflective substrate 20 and the heat sink 22 have to be chosen from components having relatively larger surface area. That is, the space requirements often exceed expectations. Furthermore, the phenomena of hot spot and heat diffusion causes high manufacturing cost and difficulty of the fixed phosphor plate module 2.

There is a need of providing an illumination system and a wavelength-converting device thereof to obviate the drawbacks encountered from the prior art.

SUMMARY OF THE INVENTION

It is an object of the present invention to provide an illumination system and a wavelength-converting device thereof in order to overcome the above-mentioned drawbacks encountered by the prior arts.

The present invention provides an illumination system and a wavelength-converting device thereof. Since the phosphor plate is a solid mixture, having 10-70 weight percent of phosphor agent and a binder, for transforming the first waveband light into a second waveband light, the efficiency of heat conduction of the phosphor plate is effectively enhanced, thereby enhancing the converting efficiency of the wavelength-converting device, which is strong enough to be applied to rotate with great rigidity.

The present invention also provides an illumination system and a wavelength-converting device thereof. The wavelength-converting device is applied as a rotational wavelength-converting device without utilizing any heat sink, not only the space requirement is reduced, but also the phenomena of hot spot and heat diffusion are avoided, such that the cost and difficulty of manufacturing the wavelength-converting device are significantly reduced.

The present invention further provides an illumination system and a wavelength-converting device thereof. By polishing the light output surface of the phosphor plate and forming a polished surface, the efficiency of receiving lights of the phosphor plate is enhanced, and further the converting efficiency of the wavelength-converting device is also enhanced.

In accordance with an aspect of the present invention, there is provided an illumination system. The illumination system includes a solid-state light-emitting element and a wavelength-converting device. A first waveband light is emitted to an optical path by the solid-state light-emitting element. The wavelength-converting device is disposed on the optical path and includes a phosphor plate. The phosphor plate is a solid mixture having a phosphor agent and a binder. The weight percent of the phosphor agent is from 10 to 70, such that the first waveband light is transformed into a second waveband light.

In accordance with another aspect of the present invention, there is provided a wavelength-converting device of an illumination system emitting a first waveband light to an optical path. The wavelength-converting device includes a phosphor plate disposed on the optical path for receiving the first waveband light, wherein the phosphor plate is a solid mixture having a phosphor agent and a binder, the weight percent of the phosphor agent is from 10 to 70, such that the first waveband light is transformed into a second waveband light.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
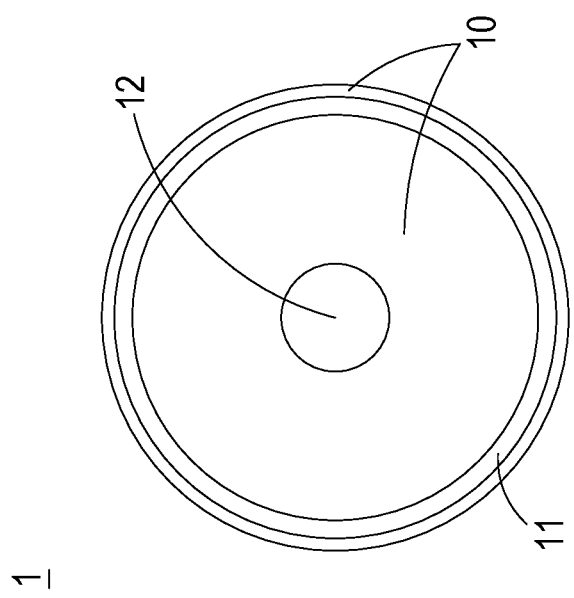
FIG. 2 schematically illustrates the structure of a fixed phosphor plate module of prior art.
Figure 1:
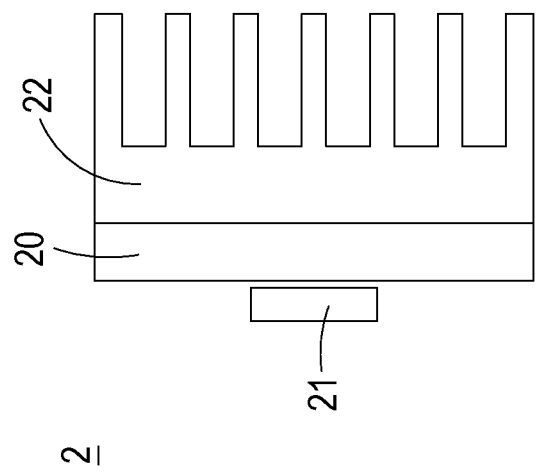
FIG. 1 schematically illustrates the structure of a rotational phosphor wheel of prior art.
Figure 3B:
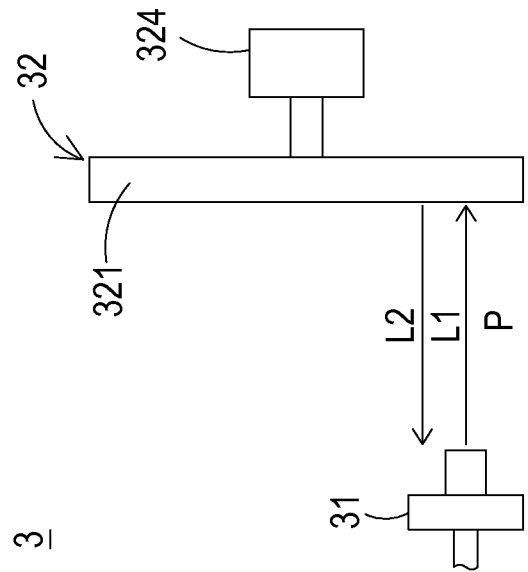
FIG. 3B schematically illustrates the configuration of an illumination system according to another embodiment of the present invention.
Figure 3A:
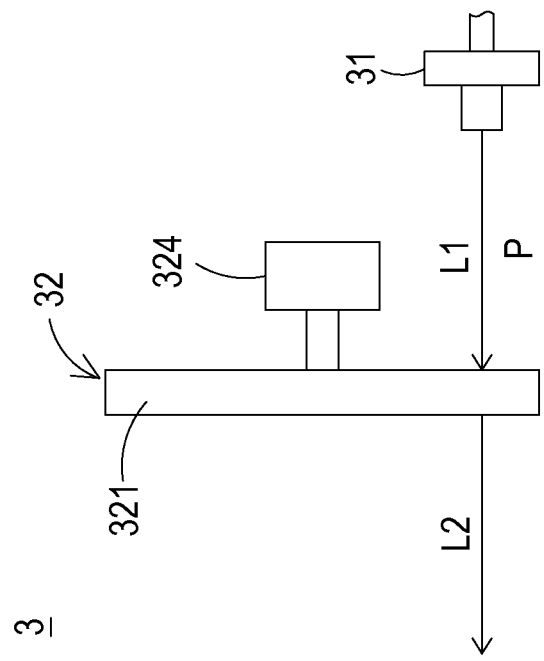
FIG. 3A schematically illustrates the configuration of an illumination system according to an embodiment of the present invention.

Please refer to FIG. 3A and FIG. 3B. FIG. 3A schematically illustrates the configuration of an illumination system according to an embodiment of the present invention. FIG. 3B schematically illustrates the configuration of an illumination system according to another embodiment of the present invention. As shown in FIG. 3A and FIG. 3B, an illumination system 3 of the present invention includes a solid-state light-emitting element 31 and a wavelength-converting device 32. A first waveband light L1 is emitted to an optical path P by the solid-state light-emitting element 31. The wavelength-converting device 32 is disposed on the optical path P and includes a phosphor plate 321. The phosphor plate 321 is a solid mixture having a phosphor agent and a binder. The weight percent of the phosphor agent is from 10 to 70 (compared with the total weight of the phosphor plate 321), the weight percent of the binder is for example from 30 to 90 (compared with the total weight of the phosphor plate 321), and the binder is for examples of glass or $Al_2O_3$, but not limited thereto, such that the first waveband light L1 is transformed into a second waveband light L2. In some embodiments, the wavelength-converting device 32 is not limited to a transmissive wavelength-converting device (as shown in FIG. 3A) or a reflective wavelength-converting device (as shown in FIG. 3B). In other words, in the embodiments shown in FIG. 3A, the incident direction of the first waveband light L1 is identical to the output direction of the second waveband light L2. In the embodiments shown in FIG. 3B, the incident direction of the first waveband light L1 is opposite to the output direction of the second waveband light L2. As a result, the efficiency of heat conduction of the phosphor plate 321 is effectively enhanced, thereby enhancing the converting efficiency of the wavelength-converting device, which is strong enough to be applied to rotate with great rigidity.

In some embodiments, the binder can be glass or $Al_2O_3$ as the embodiment mentioned above, or the binder may further includes ceramic additives, such like $BaSO_4$, AlN and BN, for enhancing the efficiency of heat-dissipation. The formula of the glass is $SiO_x$, $0<x\leq2$, and the refraction coefficient n of the glass is less than or equal to 1.5. Compared with the applications of the combination of glass and phosphor powder in LED field, since the required refraction coefficient n of the glass in LED field is greater than or equal to 2, the differences between the applications in LED field and the present invention are obvious, and the concept of the present invention is distinct from the applications in LED field. Which is to say, the development direction of the wavelength-converting device 32 of the present invention is opposite to the development direction of LED field, and the problems solved are also different.

Figure 5:
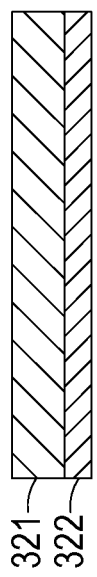
FIG. 5 schematically illustrates the cross-sectional view of a wavelength-converting device according to another embodiment of the present invention.
Figure 4:
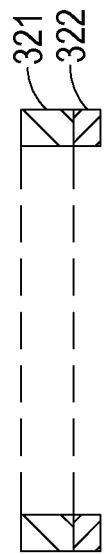
FIG. 4 schematically illustrates the cross-sectional view of a wavelength-converting device according to an embodiment of the present invention.

Please refer to FIG. 4 and FIG. 5. FIG. 4 schematically illustrates the cross-sectional view of a wavelength-converting device according to an embodiment of the present invention. FIG. 5 schematically illustrates the cross-sectional view of a wavelength-converting device according to another embodiment of the present invention. In some embodiments, the wavelength-converting device 32 may be designed without substrate, and the wavelength-converting device 32 may further include an optical layer 322. The optical layer 322 is formed on a surface of the phosphor plate 321, and the phosphor plate 321 is not limited to a sheet phosphor plate (as shown in FIG. 4) or a ring-shaped phosphor plate (as shown in FIG. 5). In particular, the optical layer 322 is deposited or coated on the surface of the phosphor plate 321, and the optical layer 322 is disposed on a side in opposite to a light output surface of the phosphor plate 321. That is, the surface is disposed in opposite to the light output surface.

Figures 6, 7:
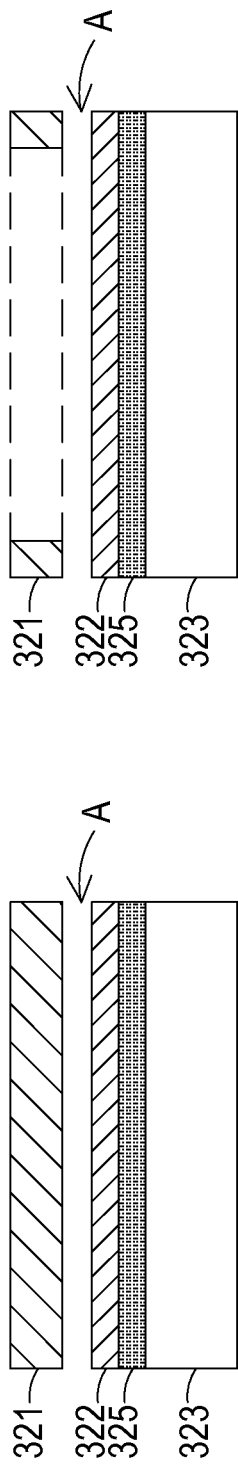
FIG. 6 schematically illustrates the cross-sectional view of a wavelength-converting device according to still another embodiment of the present invention.
FIG. 7 schematically illustrates the cross-sectional view of a wavelength-converting device according to still another embodiment of the present invention.

Please refer to FIG. 6 and FIG. 7. FIG. 6 schematically illustrates the cross-sectional view of a wavelength-converting device according to still another embodiment of the present invention. FIG. 7 schematically illustrates the cross-sectional view of a wavelength-converting device according to still another embodiment of the present invention. In some embodiments, the phosphor plate 321 of the wavelength-converting device 32 of the present invention is a sheet phosphor plate (as shown in FIG. 6) or a ring-shaped phosphor plate (as shown in FIG. 7). The wavelength-converting device 32 may further include an optical layer 322 and a substrate 323, and the optical layer 322 is formed on the substrate 323. Particularly, the optical layer 322 is disposed on a side in opposite to a light output surface of the phosphor plate 321. On the other hand, the wavelength-converting device may further include a bonding layer 325 disposed between the optical layer 322 and the substrate 323, and the bonding layer is made of $SiO_2$ or $TiO_2$.

In the above-mentioned embodiments shown in FIG. 4 to FIG. 7, while being applied to a transmissive wavelength-converting device, the optical layer 322 is preferably a dichroic layer for allowing the first waveband light L1 to transmit through and reflecting the second waveband light L2. Contrary, while being applied to a reflective wavelength-converting device, the optical layer 322 is preferably a all-reflective layer or a dichroic layer for comprehensively reflecting all of the first waveband light L1 and the second waveband light L2, or reflecting only the second waveband light L2.

Figure 9:
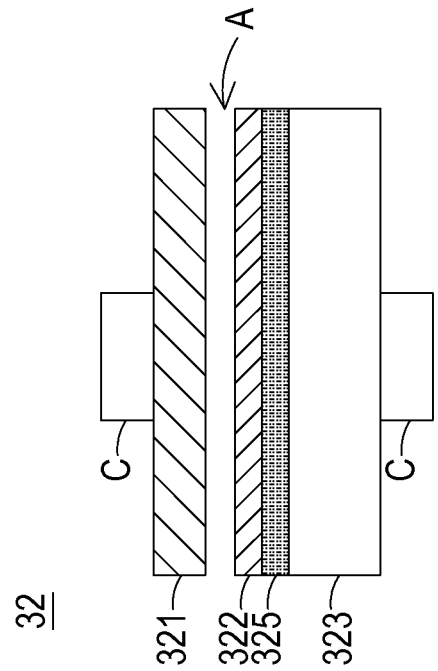
FIG. 9 schematically illustrates an air gap formed through clipping.
Figure 8:
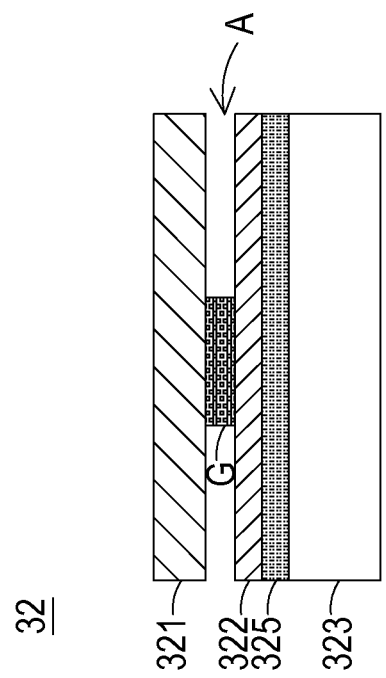
FIG. 8 schematically illustrates an air gap formed through adhering.

Please refer to FIG. 8 and FIG. 9. FIG. 8 schematically illustrates an air gap formed through adhering. FIG. 9 schematically illustrates an air gap formed through clipping. As shown in FIG. 8 and FIG. 9, an air gap A is formed between the phosphor plate 321 and the optical layer 322 for enhancing the optical properties, such like changing the refraction coefficient n, but not limited thereto. The air gap A is for example formed through adhering or clipping. As shown in FIG. 8, the phosphor plate 321 and the optical layer 322 is partially adhered with each other through the adhesive glue G, and the air gap is formed through adhering. As shown in FIG. 9, the phosphor plate 321 and the optical layer 322 are clipped together by the clipper C, and the air gap A is naturally formed between the phosphor plate 321 and the optical layer 322. Nevertheless, the method of forming the air gap A is not limited herein.

Please refer to FIG. 3A to FIG. 9. The wavelength-converting device 32 of the present invention can be installed on the axis of the motor 324 for being applied to rotate. As a result, the wavelength-converting device 32 is applied as a rotational wavelength-converting device without utilizing any heat sink, not only the space requirement is reduced, but also the phenomena of hot spot and heat diffusion are avoided, such that the cost and difficulty of manufacturing the wavelength-converting device 32 are significantly reduced.

Figure 11:
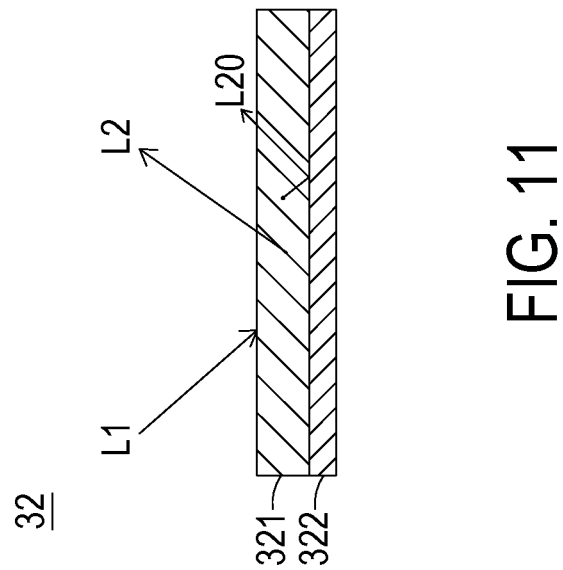
FIG. 11 schematically illustrates the scattering lights reflected by an optical layer of a reflective wavelength-converting device.
Figure 10:
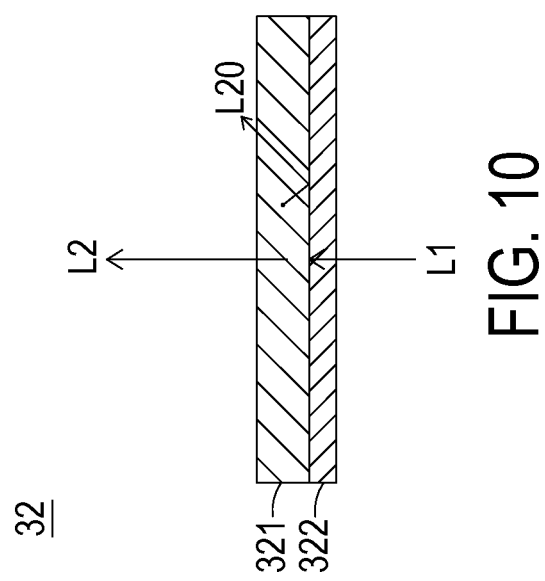
FIG. 10 schematically illustrates the scattering lights reflected by an optical layer of a transmissive wavelength-converting device.

Please refer to FIG. 10 and FIG. 11. FIG. 10 schematically illustrates the scattering lights reflected by an optical layer of a transmissive wavelength-converting device. FIG. 11 schematically illustrates the scattering lights reflected by an optical layer of a reflective wavelength-converting device. As shown in FIG. 10 and FIG. 11, after the first waveband light L1 is received by the phosphor plate 321 of the wavelength-converting device 32, the first waveband light L1 is excited as a second waveband light L2. The second waveband light L2 is configured as full-angle scattering. When a scattering light L20 is backscattered to the optical layer 322, the scattering light L20 is reflected by the optical layer 322 and outputted through the light output surface of the phosphor plate 321. That is, the higher the efficiency of reflection of the optical layer 322 is, the better the efficiency of wavelength conversion of the wavelength-converting device 32 is.

Figure 13:
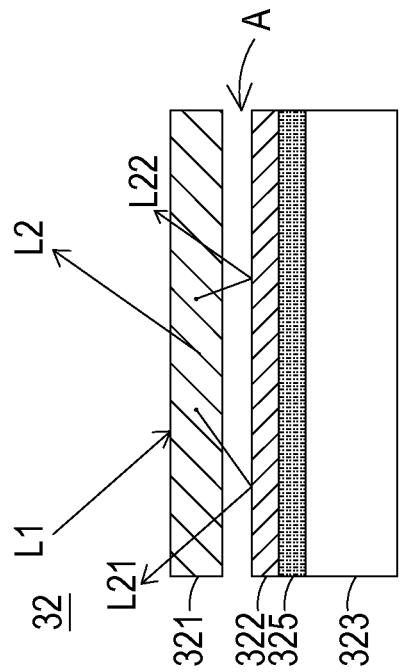
FIG. 13 schematically illustrates the scattering lights reflected by an optical layer of a reflective wavelength-converting device having a substrate.
Figure 12:
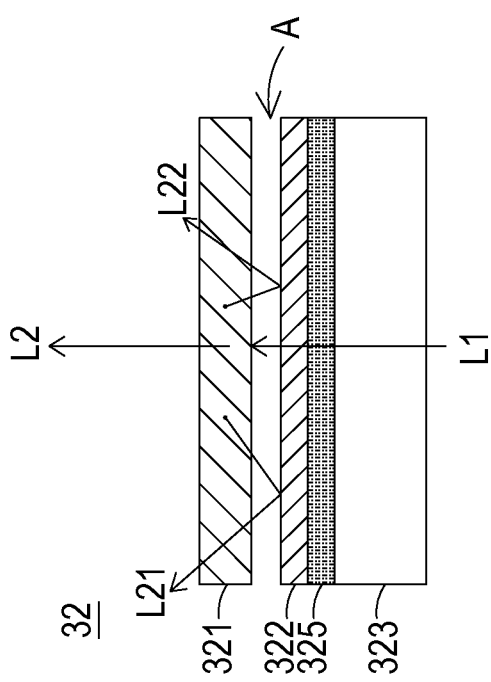
FIG. 12 schematically illustrates the scattering lights reflected by an optical layer of a transmissive wavelength-converting device having a substrate.

Please refer to FIG. 12 and FIG. 13. FIG. 12 schematically illustrates the scattering lights reflected by an optical layer of a transmissive wavelength-converting device having a substrate. FIG. 13 schematically illustrates the scattering lights reflected by an optical layer of a reflective wavelength-converting device having a substrate. As shown in FIG. 12 and FIG. 13, after the first waveband light L1 is received by the phosphor plate 321 of the wavelength-converting device 32, the first waveband light L1 is excited as a second waveband light L2 by the phosphor plate 321. The second waveband light L2 is configured as full-angle scattering. When a large-angle scattering light L21 is backscattered to the air gap A, the large-angle scattering light L21 is total reflected by the air gap A and outputted through the light output surface. Moreover, when a small-angle scattering light L22 is backscattered to the optical layer 322, the small-angle scattering light L22 is reflected by the optical layer 322 and outputted through the light output surface. In other words, by forming the air gap A between the phosphor plate 321 and the optical layer 322, the total reflection principle can be applied and the large-angle scattering light L21 can be outputted so as to be used for enhancing the efficiency of wavelength conversion of the wavelength-converting device 32 of the present invention.

In some embodiments, the phosphor agent is not limited to monocrystalline phosphor powder or polycrystalline phosphor powder. In addition, functional additives, such like BN, AlN or $BaSO_4$, may be added in the manufacturing process of the phosphor plate 321, but not limited thereto. For providing high performance of optical reflection, the optical layer 322 is preferably selected from at least one of Au, Ag, Al, or the group consisting of Au, Ag and Al. Certainly, the optical layer 322 may be selected from dielectric materials. In some embodiments, the substrate 323 is a metal substrate, a ceramic substrate, a wafer substrate or a composition substrate. The material of the metal substrate is selected from Au, Ag, Al, or the alloys thereof. The material of the ceramic substrate is selected from AlN, BN, $Al_2O_3$, glass, and $CaF_2$. The wafer substrate is a silicon wafer, a silicon carbide wafer, a silicon carbide, a sapphire and graphene wafer or any other compound semiconductor wafers groups. The composition substrate is a graphite substrate, a graphite and aluminum substrate or a graphite and silicon carbide substrate, but not limited thereto.

In some embodiments, the thickness of the phosphor plate 321 of the wavelength-converting device 32 of the present invention is preferably greater than or equal to 50 micrometers (um), and less than or equal to 1000 micrometers (um). In an embodiment, the phosphor plate 321 is sintered by 20 weight percent of phosphor agent and 80 weight percent of glass. The thickness and the diameter of the phosphor plate 321 are respectively 540 mm and 10 cm, but not limited herein. According to the experimental results of this embodiment, although the weight percent of the phosphor agent is only 20, a gain of at least 15% is obtained by the present invention compared with the prior art, which has phosphor powder about 70 weight percent. Since the proportion of the phosphor agent of the present invention is from 10 to 70 weight percent and the thickness of the phosphor plate 321 is from 50 to 1000 mm, the maximum of the gain is not limited herein.

On the other hand, the light output surface of the phosphor plate 321 is polished as a polished surface for enhancing the optical properties of the wavelength-converting device 32. As a result, the efficiency of receiving lights of the phosphor plate 321 is enhanced, and further the efficiency of wavelength conversion of the wavelength-converting device 32 is also enhanced.

Figure 14:
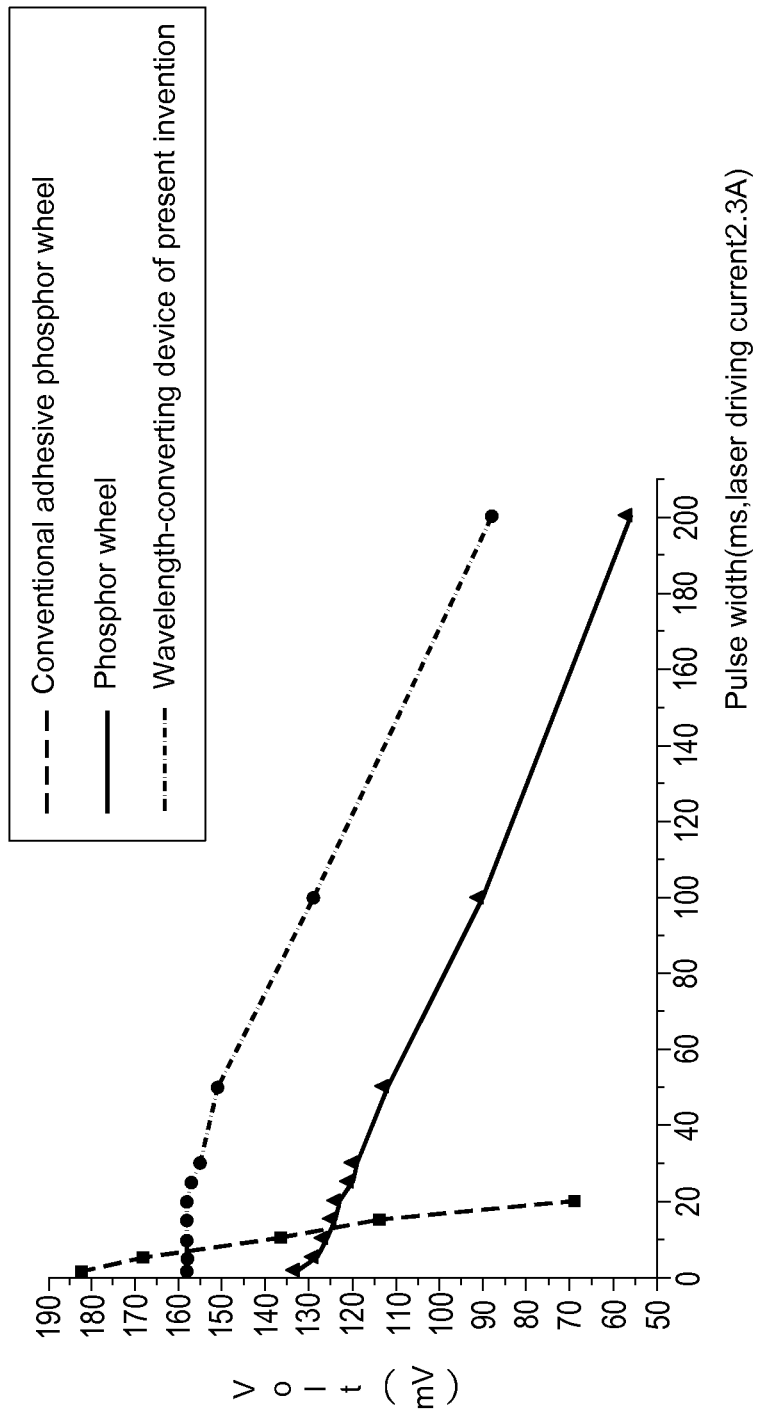
FIG. 14 schematically illustrates the performance voltage-pulse width diagram of a wavelength-converting device of the present invention and a conventional wavelength-converting device of prior art.

Please refer to FIG. 14. FIG. 14 schematically illustrates the performance voltage-pulse width diagram of a wavelength-converting device of the present invention and a conventional wavelength-converting device of prior art. As shown in FIG. 14, when the solid-state light-emitting element 31 is a laser source, the driving current of the laser source is 2.3 A, and the output power is 3.5 W, since the conventional adhesive phosphor wheel has the worst efficiency of heat-dissipation, the performance gets a fastest decay. The total performance of the conventional adhesive phosphor wheel is also the worst. In addition, when a phosphor wheel is manufactured by utilizing YAG phosphor powder, the performance of the phosphor wheel is ordinary. However, the decay of the performance is reduced compared with the conventional adhesive phosphor wheel, hence the performance of the phosphor wheel is obviously better than the performance of the conventional adhesive phosphor wheel. On the other hand, the performance of the wavelength-converting device 32 of the present invention is obviously better than the phosphor wheel, and the decay rate and decay extent are the smallest of these three examples. In brief, compared with the conventional adhesive phosphor wheel and the (pure) phosphor wheel, the wavelength-converting device 32 of the present invention has the best performances.

Figure 15:
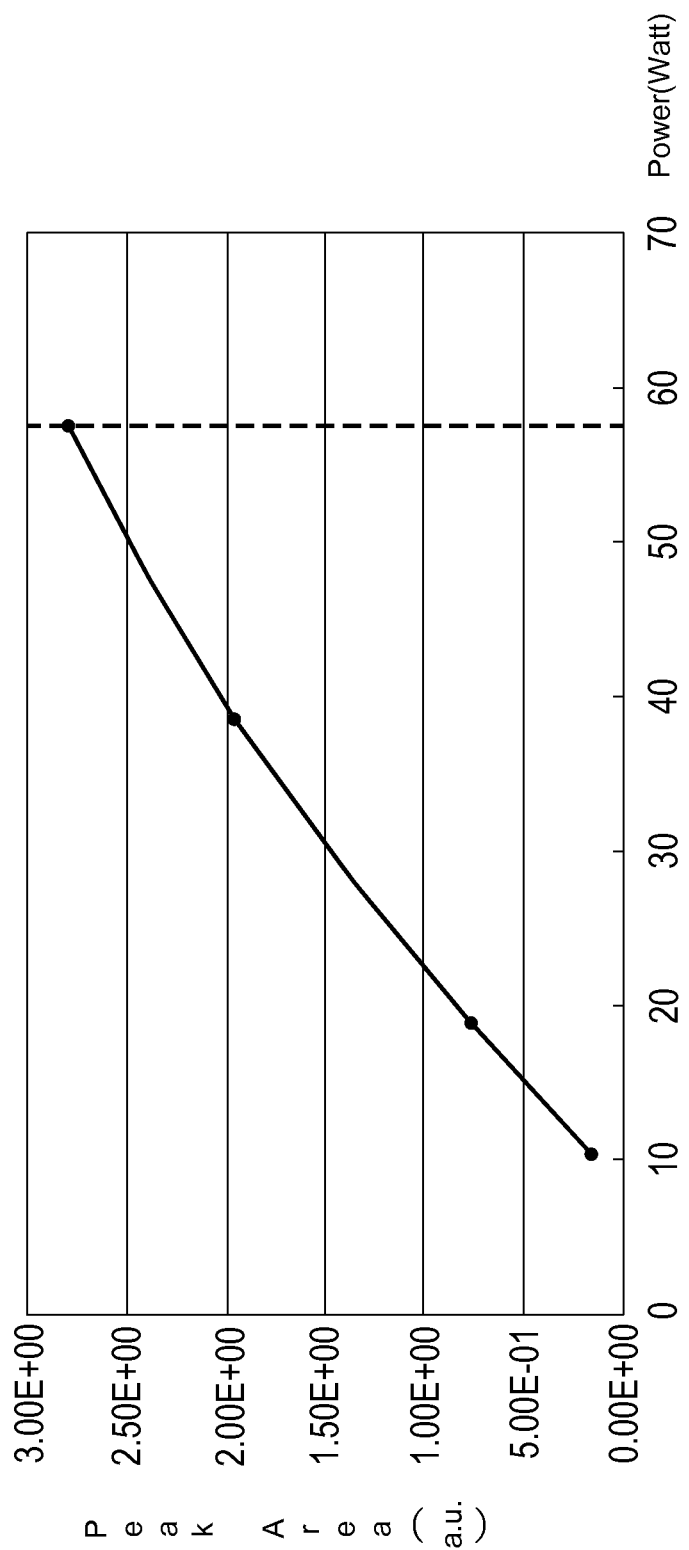
FIG. 15 schematically illustrates the peak area-power diagram of a wavelength-converting device of the present invention.

Please refer to FIG. 15. FIG. 15 schematically illustrates the peak area-power diagram of a wavelength-converting device of the present invention. The peak area-power diagram of the wavelength-converting device 32 of the present invention applied to a high-energy illumination system is shown in FIG. 15. When the output power of the solid-state light-emitting element 31 is continuously increased, the total peak value performance has a substantially linear growth. According to the experimental results, the wavelength-converting device 32 of the present invention can be applied to a high-power environment higher than 60 watts.

From the above description, the present invention provides an illumination system and a wavelength-converting device thereof. Since the phosphor plate is a solid mixture having 10-70 weight percent of phosphor agent and a binder for transforming the first waveband light into a second waveband light, the efficiency of heat conduction of the phosphor plate is effectively enhanced, thereby enhancing the converting efficiency of the wavelength-converting device, which is strong enough to be applied to rotate with great rigidity. Meanwhile, the wavelength-converting device is applied as a rotational wavelength-converting device without utilizing any heat sink, not only the space requirement is reduced, but also the phenomena of hot spot and heat diffusion are avoided, such that the cost and difficulty of manufacturing the wavelength-converting device are significantly reduced. Moreover, by polishing the light output surface of the phosphor plate and forming a polished surface, the efficiency of receiving lights of the phosphor plate is enhanced, and further the converting efficiency of the wavelength-converting device is also enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An illumination system, comprising:
    a solid-state light-emitting element, wherein a first waveband light is emitted to an optical path by the solid-state light-emitting element; and
    a wavelength-converting device disposed on the optical path and comprising:
        a phosphor plate, wherein the phosphor plate is a solid mixture having a phosphor agent and a binder, the weight percent of the phosphor agent is from 10 to 70, such that the first waveband light is transformed into a second waveband light;
        a substrate;
        an optical layer formed on the substrate and disposed on a side in opposite to a light output surface of the phosphor plate, wherein an air gap is formed between the phosphor plate and the optical layer; and
        a bonding layer disposed between the optical layer and the substrate.

2. The illumination system according to claim 1, wherein the binder is glass or $Al_2O_3$, wherein the formula of the glass is $SiO_x$, $0<x\leq2$, and the refraction coefficient n of the glass is less than or equal to 1.5.

3. The illumination system according to claim 2, wherein the binder further comprises ceramic additives.

4. The illumination system according to claim 1, wherein the phosphor plate is a ring-shaped phosphor plate or a sheet phosphor plate.

5. The illumination system according to claim 1, wherein the light output surface is a polished surface.

6. The illumination system according to claim 1, wherein the air gap is formed through adhering or clipping.

7. The illumination system according to claim 1, wherein the bonding layer is made of $SiO_2$ or $TiO_2$.

8. The illumination system according to claim 1, wherein the thickness of the phosphor plate is greater than or equal to 50 micrometers, and is less than or equal to 1000 micrometers.

9. A wavelength-converting device of an illumination system emitting a first waveband light to an optical path, comprising:
    a phosphor plate disposed on the optical path for receiving the first waveband light, wherein the phosphor plate is a solid mixture having a phosphor agent and a binder, the weight percent of the phosphor agent is from 10 to 70, such that the first waveband light is transformed into a second waveband light;
    a substrate;
    an optical layer formed on the substrate and disposed on a side in opposite to a light output surface of the phosphor plate, wherein an air gap is formed between the phosphor plate and the optical layer; and
    a bonding layer disposed between the optical layer and the substrate.

10. The wavelength-converting device according to claim 9, wherein the light output surface is a polished surface.

11. The wavelength-converting device according to claim 9, wherein the bonding layer is made of $SiO_2$ or $TiO_2$.

* * * * *